United States Patent [19]
Roh

[11] Patent Number: 6,097,652
[45] Date of Patent: Aug. 1, 2000

[54] INTEGRATED CIRCUIT MEMORY DEVICES INCLUDING CIRCUITS AND METHODS FOR DISCHARGING ISOLATION CONTROL LINES INTO A REFERENCE VOLTAGE

[75] Inventor: Jae-gu Roh, Kyungki-do, Rep. of Korea

[73] Assignee: Samsung Electronics Co., Ltd., Rep. of Korea

[21] Appl. No.: 09/372,372

[22] Filed: Aug. 11, 1999

[30] Foreign Application Priority Data

Aug. 13, 1998 [KR] Rep. of Korea ................. 98-32890
May 4, 1999 [KR] Rep. of Korea ................. 99-16004

[51] Int. Cl.[7] ........................................ G11C 7/00
[52] U.S. Cl. ................................. 365/205; 365/203
[58] Field of Search ................................ 365/205, 203, 365/190, 207

[56] References Cited

U.S. PATENT DOCUMENTS

| 5,243,574 | 9/1993 | Ikeda ................. 365/207 |
| 5,396,465 | 3/1995 | Oh et al. ............. 365/201 |
| 5,905,685 | 5/1999 | Nakamura et al. ...... 365/207 |
| 5,991,216 | 11/1999 | Raad et al. ......... 365/205 |
| 6,016,279 | 1/2000 | Chi ................... 365/203 |

FOREIGN PATENT DOCUMENTS 04102295  4/1992  Japan .

OTHER PUBLICATIONS

European Search Report, Ser. No. EP 99 30 5823, Dec. 16, 1999.

Primary Examiner—Tan T. Nguyen
Attorney, Agent, or Firm—Myers Bigel Sibley & Sajovec

[57] ABSTRACT

An integrated circuit memory device includes a pair of bit lines, a memory cell array connected to the pair of bit lines, a pair of sensing bit lines and a switching unit that connects the pair of bit lines and the pair of sensing bit lines in response to an isolation control signal transmitted through an isolation control line. An equalizer equalizes the pair of bit lines in response to an equalization signal that is transmitted through an equalization control line. A sense amplifier senses and amplifies a voltage difference between the pair of sensing bit lines. A discharge circuit is connected between the isolation control line and a reference voltage such as ground, to discharge the isolation control line into the reference voltage in response to an inverted isolation control signal that is transmitted through a complementary line of the isolation control line. Preferably, the discharge circuit comprises a field effect transistor such as an NMOS transistor, the source and drain of which are connected between the isolation control line and the reference voltage and the gate of which is connected to the complementary line of the isolation control line.

30 Claims, 4 Drawing Sheets

6,097,652

INTEGRATED CIRCUIT MEMORY DEVICES INCLUDING CIRCUITS AND METHODS FOR DISCHARGING ISOLATION CONTROL LINES INTO A REFERENCE VOLTAGE

FIELD OF THE INVENTION

This invention relates to integrated circuit memory devices and more particularly to systems and methods for controlling integrated circuit memory devices.

BACKGROUND OF THE INVENTION

Integrated circuit memory devices are widely used in consumer and commercial applications. As the integration density of integrated circuit memory devices continues to increase, it generally is desirable to increase the operational speed thereof. One widely used integrated circuit memory device is an integrated circuit Dynamic Random Access Memory (DRAM). In order to provide high-speed operations, synchronous DRAMs and Double Data Rate (DDR) DRAMs also have been developed.

Large capacity integrated circuit memory devices such as synchronous DRAM and DDR DRAM devices may have a layout in which a column decoder is vertically arranged as shown in FIG. 1. As shown in FIG. 1, the length in the word line direction may be longer than in the column direction.

Referring now to FIG. 1, a conventional large capacity memory device may include a plurality of memory cell arrays 11 arranged in a matrix of rows and columns, a plurality of sense amplification blocks 13 arranged at either side of each memory cell array 11, a plurality of sub word line drivers (SWD) 15 arranged at the upper and lower ends of the memory cell arrays 11, a plurality of conjunction regions 17 arranged at the upper and lower ends of the sense amplification blocks 13, a column decoder 18 arranged on the left of the matrix of the plurality of memory cell arrays 11, and a row decoder 19 arranged at the lower end of the matrix of the plurality of memory cell arrays 11. It will be understood that as used herein, the terms "upper/lower," "left/right," and "row/column" indicates relative directions and do not indicate absolute orientations.

FIG. 2 is a circuit diagram of sense amplification blocks and conjunction regions of the memory device shown in FIG. 1 using conventional technology. The conjunction regions 27a and 27b are arranged at the upper and lower ends of the sense amplification blocks 23. Each sense amplification block 23 generally has a folded bit line-shared sense amplifier structure. The sense amplification block 23 includes: a) a first switching unit 102 for connecting a first pair of bit lines BLi and $\overline{BLi}$ to a pair of sensing bit lines SBLi and $\overline{SBLi}$ in response to a first isolation control signal transmitted through a first isolation control line ISi; b) a first equalizer 100 connected between the first pair of bit lines BLi and $\overline{BLi}$ for equalizing the first pair of bit lines BLi and $\overline{BLi}$ in response to a first equalizing signal transmitted through a first equalization control line EQi; c) a second switching unit 106 for connecting a second pair of bit lines BLj and $\overline{BLj}$ to the pair of sensing bit lines SBLi and $\overline{SBLi}$ in response to a second isolation control signal transmitted through a second isolation control line ISj; and d) a second equalizer 108 connected between the second pair of bit lines BLj and $\overline{BLj}$ for equalizing the second pair of bit lines BLj and $\overline{BLj}$ in response to a second equalizing signal transmitted through a second equalizing control line EQj, and a sense amplifier 104 for sensing the voltage difference between the pair of sensing bit lines SBLi and $\overline{SBLi}$ and amplifying the voltage difference.

As shown in FIG. 1, a memory cell array (i) is connected to the first pair of bit lines BLi and $\overline{BLi}$ and a memory cell array (j) is connected to the second pair of bit lines BLj and $\overline{BLj}$.

The conjunction regions 27a and 27b include LA and $\overline{LA}$ drivers for respectively enabling the P-type and N-type sense amplifiers of the sense amplifier 104, a transfer transistor for connecting a local input and output line LIO connected to the sense amplifier 104 to a global input and output line GIO, and a control circuit for controlling the sub word line drivers.

A first isolation control signal, applied to the gates of isolation transistors 34 and 35 of the first switching unit 102, and a second isolation control signal, applied to the gates of the isolation transistors 42 and 43 of the second switching unit 106, are generated from peripheral circuits connected to the first isolation control line ISi and the second isolation control line ISj, i.e., isolation control signal generators 28 and 29.

In a memory device having the structure in which the row decoder is vertically arranged, i.e., the structure in which the length in the wordline direction is long and the local and global input and output lines are used, the length of the first and second isolation control lines ISi and ISj may become longer than those of the structure in which the row decoder is horizontally arranged. Accordingly, the load of the first isolation control line ISi and the second isolation control line ISj, i.e., a parasitic capacitance, may increase, for example, to more than two times the load.

When the memory cell array (i) connected to the first pair of bit lines BLi and $\overline{BLi}$ is activated and operates, the voltage of first isolation control signal transmitted through the first isolation control line ISi is at a boosted voltage level VPP. The voltage of the second isolation control signal transmitted through the second isolation control line ISj is at ground voltage level VSS. This may reduce the load of the sense amplifier 104 by disconnecting the second pair of bit lines BLj and $\overline{BLj}$ from the pair of sensing bit lines SBLi and $\overline{SBLi}$ by turning off the second switching unit 106.

When the load of the second isolation control line ISj is large, the discharging speed of the second isolation control line ISj may be reduced. Accordingly, the point in time at which the second isolation control signal becomes grounded at voltage VSS may be delayed. In this case, the load of the sense amplifier 104 may become larger since the second switching unit 106 is not turned off during the sensing operation. Thus, the second pair of bit lines BLj and $\overline{BLj}$ are not isolated from the pair of sensing bit lines SBLi and $\overline{SBLi}$. Accordingly, the charge sharing time between the first pair of bit lines BLi and $\overline{BLi}$ and the pair of sensing bit lines SBLi and $\overline{SBLi}$ may increase. As a result, the operation of the sense amplifier 104 may be delayed.

The size of the driver ports of the isolation control signal generators 28 and 29 connected to the first isolation control line ISi and the second isolation control line ISj may be made as large as possible in a conventional device in an attempt to overcome the large load of the first isolation control line ISi and the second isolation control line ISj. However, since the driving ability of the driver ports may have a limit, even if the sizes of the driver ports are made as large as possible, it still may not be possible to overcome the increased load.

SUMMARY OF THE INVENTION

It is therefore an object of the present invention to provide integrated circuit memory devices and methods of controlling the same, that can operate at high speeds.

It is another object of the present invention to provide integrated circuit memory devices and methods of controlling the same, that can operate at high speed notwithstanding a large load on an isolation control line.

These and other objects can be provided according to the present invention by discharging the isolation line into a reference voltage such as ground voltage in response to an inverted isolation control signal that is transmitted through a complementary line of an isolation control line. Accordingly, high-speed operations may be provided in integrated circuit memory devices by allowing an increase in the discharge speed of the isolation control line.

More specifically, according to the present invention, an integrated circuit memory device can include a pair of bit lines, a memory cell array connected to the pair of bit lines, a pair of sensing bit lines and a switching unit that connects the pair of bit lines and the pair of sensing bit lines in response to an isolation control signal transmitted through an isolation control line. An equalizer equalizes the pair of bit lines in response to an equalization signal that is transmitted through an equalization control line. A sense amplifier senses and amplifies a voltage difference between the pair of sensing bit lines. A discharge circuit is connected between the isolation control line and a reference voltage such as ground, to discharge the isolation control line into the reference voltage in response to an inverted isolation control signal that is transmitted through a complementary line of the isolation control line.

Preferably, the discharge circuit comprises a field effect transistor such as an NMOS transistor, the source and drain of which are connected between the isolation control line and the reference voltage and the gate of which is connected to the complementary line of the isolation control line.

A second discharge circuit also may be provided to discharge the equalization control line into the reference voltage such as ground, to thereby allow rapid discharge of the equalization control line. The second discharge circuit also may include a field effect transistor such as an NMOS transistor, the source and drain of which are serially connected between the equalization control line and the reference voltage, and the gate of which is connected to the complementary line of the equalization control line. High-speed operations of integrated circuit memory devices and controlling methods thereby may be provided.

DETAILED DESCRIPTION OF PREFERRED EMBODIMENTS

Figure 1:
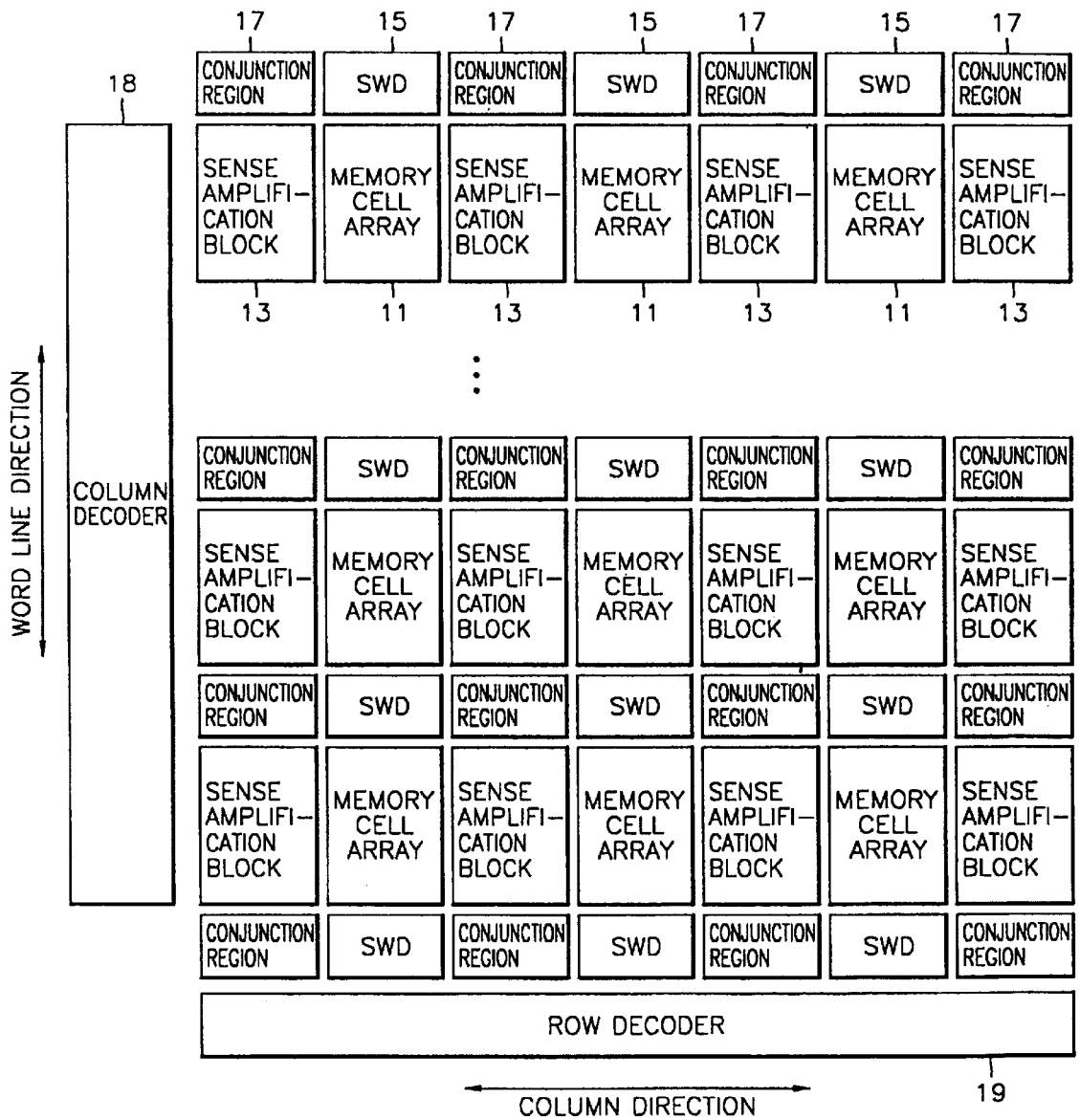
FIG. 1 is a block diagram of a conventional large capacity memory device.
Figure 2:
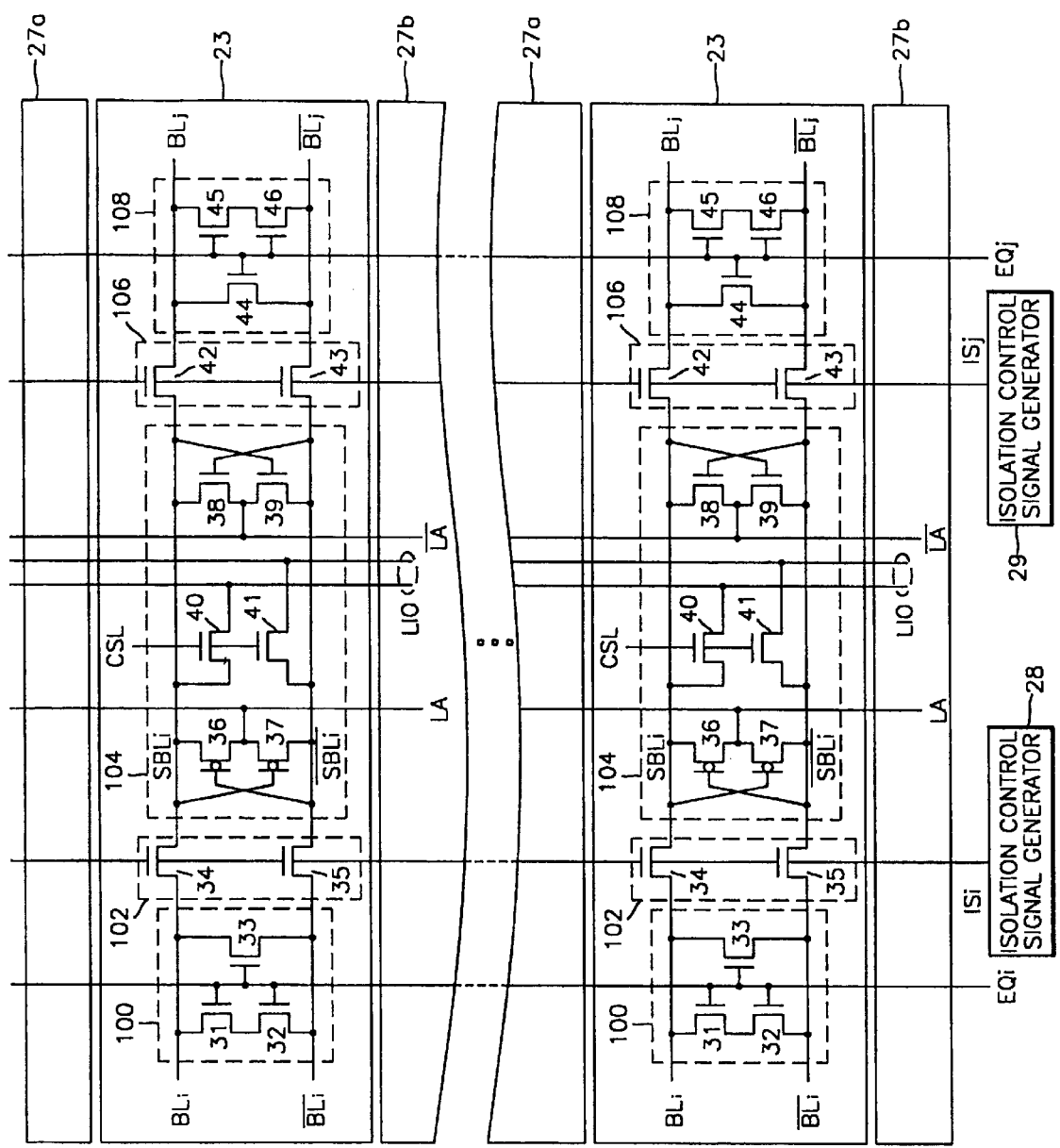
FIG. 2 is a circuit diagram of conventional sense amplification blocks and conjunction regions of the memory device shown in FIG. 1.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the size of regions is exaggerated for clarity. Like numbers refer to like elements throughout. It will be understood that when an element is referred to as being "connected to" another element, it can be directly connected to the other element, or intervening elements also may be present. In contrast, when an element is referred to as being "directly connected to" another element, there are no intervening elements present. Moreover, each embodiment described and illustrated herein includes its complementary conductivity type embodiment as well.

Figure 3:
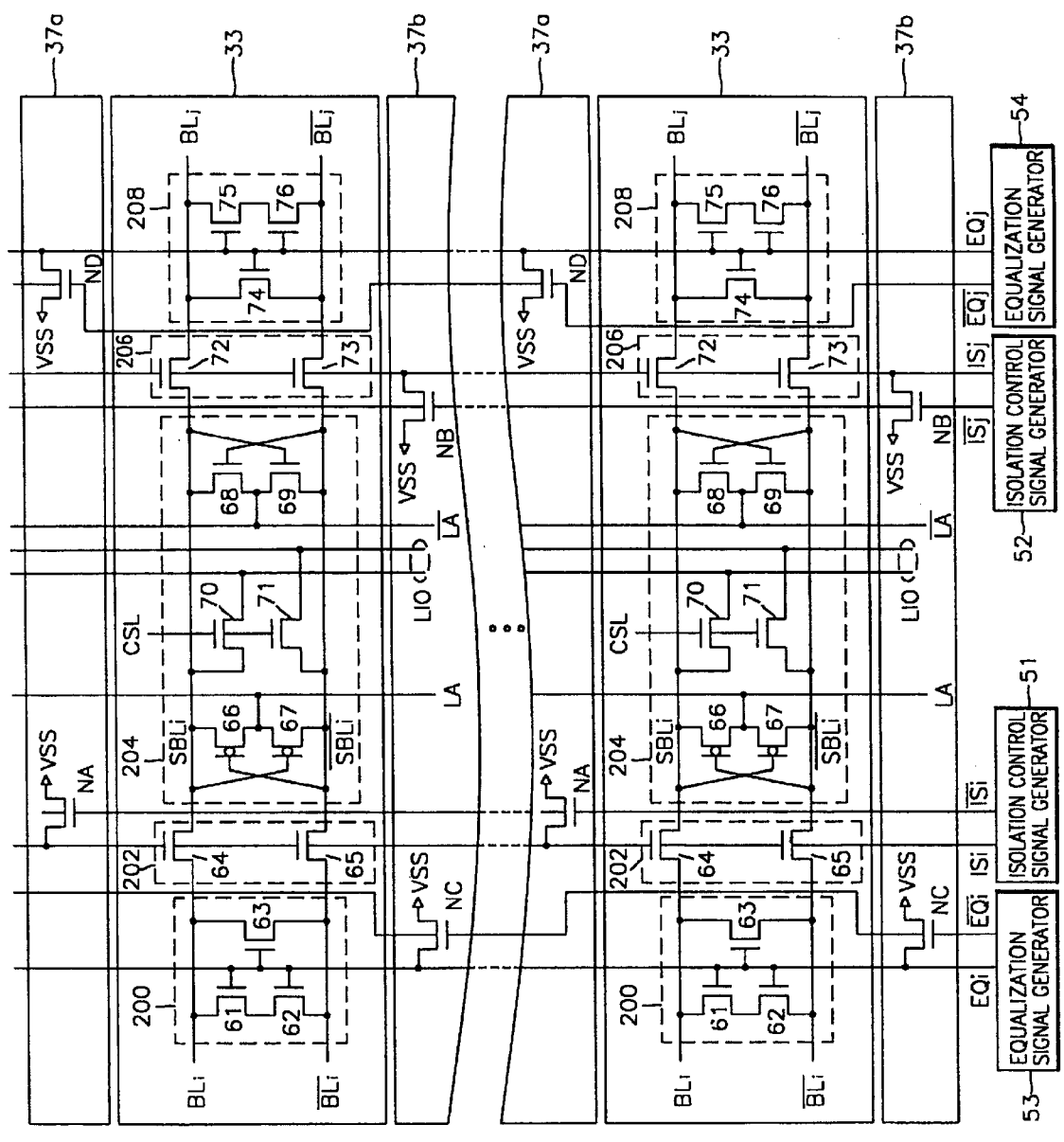
FIG. 3 is a circuit diagram of sense amplification blocks and conjunction regions of integrated circuit memory devices according to first embodiments of the present invention.

FIG. 3 is a circuit diagram of sense amplification blocks and conjunction regions of integrated circuit memory devices according to first embodiments of the present invention.

Referring to FIG. 3, memory devices according to first embodiments of the present invention include a plurality of sense amplification blocks 33 and a plurality of conjunction regions 37a and 37b arranged at the upper and lower ends of the sense amplification blocks 33 in the wordline direction.

A memory cell array (i) connected to the first pair of bit lines BLi and $\overline{BLi}$ is arranged on the left side of the sense amplification block 33. A memory cell array (j) connected to the second pair of bit lines BLj and $\overline{BLj}$ is arranged on the right side of the sense amplification block 33. Thus, the memory cell array (i) is arranged on the left side of the sense amplification block 33 and the memory cell array (j) is arranged on the right side of the sense amplification block 33, in the column direction.

In particular, the conjunction regions 37a include a discharging unit NA connected between a first isolation control line ISi and the reference voltage such as ground VSS, the discharging unit NA being controlled by a signal transmitted through the complementary line $\overline{ISi}$ of the first isolation control line ISi, i.e., the inverted signal of a first isolation control signal. A discharging unit ND is connected between a second equalization control line EQj and ground VSS, the discharging unit ND being controlled by a signal transmitted through the complementary line $\overline{EQj}$ of the second equalization control line EQj, i.e., the inverted signal of a second equalization signal. Preferably, the discharging unit NA is comprised of an NMOS transistor, the drain of which is connected to the first isolation control line ISi, the gate of which is connected to the complementary line $\overline{ISi}$ of the first isolation control line, and the source of which is connected to the ground VSS. It will be understood that the source and drain connections may be reversed and a PMOS transistor may be used. The discharging unit ND preferably comprises an NMOS transistor, the drain of which is connected to the second equalization control line EQj, the gate of which is connected to the complementary line $\overline{EQj}$ of the second equalization control line, and the source of which is connected to VSS. Again, the source and drain connections may be reversed and a PMOS transistor may be used.

The conjunction regions 37b include a discharging unit NB connected between a second isolation control line ISj and ground VSS, the discharging unit NB being controlled by a signal transmitted through the complementary line $\overline{ISj}$ of the second isolation control line ISj, i.e., the inverted signal of a second isolation control signal. A discharging unit NC is connected between a first equalization control line EQi and the ground VSS, the discharging unit NC being controlled by a signal transmitted through the complementary line $\overline{\text{EQi}}$ of the first equalization control line EQi, i.e., the inverted signal of a first equalization signal. Preferably, the discharging unit NB is comprised of an NMOS transistor, the drain of which is connected to the second isolation control line ISj, the gate of which is connected to the complementary line $\overline{\text{ISj}}$ of the second isolation control line, and the source of which is connected to the ground VSS. Again, the source and drain connections may be reversed and a PMOS transistor may be used. The discharging unit NC preferably is comprised of an NMOS transistor, the drain of which is connected to the first equalization control line EQi, the gate of which is connected to the complementary line $\overline{\text{EQi}}$ of the first equalization control line, and the source of which is connected to VSS. Again, the source and drain connections may be reversed and a PMOS transistor may be used.

The sense amplification blocks 33 have a folded bit line-shared sense amplifier structure. The sense amplification blocks 33 include a pair of sensing bit lines SBLi and $\overline{\text{SBLi}}$, a first equalizer 200, a first switching unit 202, a sense amplifier 204, a second switching unit 206, and a second equalizer 208.

The first equalizer 200 includes three NMOS transistors 61, 62, and 63 connected between the first pair of bit lines BLi and $\overline{\text{BLi}}$, the gates of which are connected to a first equalization control line EQi, to equalize the first pair of bit lines BLi and $\overline{\text{BLi}}$ in response to the first equalization signal transmitted through the first equalization control line EQi. Again, the source and drain connections may be reversed and PMOS transistors may be used. The first switching unit 202 includes two NMOS isolation transistors 64 and 65, the sources and drains of which are respectively connected between the first pair of bit lines BLi and $\overline{\text{BLi}}$ and the pair of sensing bit lines SBLi and $\overline{\text{SBLi}}$, and the gates of which are connected to the first isolation control line ISi. Again, the source and drain connections may be reversed and a PMOS transistor may be used. Thus, the first switching unit 202 connects the first pair of bit lines BLi and $\overline{\text{BLi}}$ to the pair of sensing bit lines SBLi and $\overline{\text{SBLi}}$ in response to the first isolation control signal transmitted through the first isolation control line ISi.

The second equalizer 208 includes three NMOS transistors 74, 75, and 76 connected between the second pair of bit lines BLj and $\overline{\text{BLj}}$, the gates of which are connected to a second equalization control line EQj, to equalize the second pair of bit lines BLj and $\overline{\text{BLj}}$. Again, the source and drain connections may be reversed and PMOS transistors may be used. The second switching unit 206 includes two NMOS isolation transistors 72 and 73, the sources and drains of which are respectively connected between the second pair of bit lines BLj and $\overline{\text{BLj}}$ and the pair of sensing bit lines SBLi and $\overline{\text{SBLi}}$, the gates of which are connected to a second isolation control line ISj. Again, the source and drain connections may be reversed and a PMOS transistor may be used. Thus the second switching unit 206 connects the second pair of bit lines BLj and $\overline{\text{BLj}}$ to the pair of sensing bit lines SBLi and $\overline{\text{SBLi}}$ in response to a second isolation control signal transmitted through the second isolation control line ISj.

The sense amplifier 204 includes a P-type sense amplifier comprised of PMOS transistors 66 and 67 and an N-type sense amplifier comprised of NMOS transistors 68 and 69, connected between the pair of sensing bit lines SBLi and $\overline{\text{SBLi}}$. Again, the source and drain connections may be reversed and NMOS transistors may be used. The sense amplifier 204 senses and amplifies a voltage difference between the pair of sensing bit lines SBLi and $\overline{\text{SBLi}}$ during the sensing operation.

The voltage of the pair of sensing bit lines SBLi and $\overline{\text{SBLi}}$, that is sensed and amplified by the sense amplifier 204, is transferred to the local input and output lines LIO through column selection gates 70 and 71 which are controlled by a column select line CSL. The column select line CSL is activated or deactivated by a column decoder for decoding a column address signal.

Also, the respective conjunction regions 37a and 37b include an LA driver connected to a common connection line LA of the PMOS transistors 66 and 67 of the P-type sense amplifier and driven by a P-type sense amplifier control signal. They also include an $\overline{\text{LA}}$ driver connected to a common connection line $\overline{\text{LA}}$ of the NMOS transistors 68 and 69 of the N-type sense amplifier and driven by an N-type sense amplifier control signal, a transfer transistor for connecting the pair of local input and output lines LIO and the pair of global input and output lines GIO, and a control circuit for controlling the sub word line driver.

The first isolation control signal and the inverted signal thereof are generated and output from an isolation control signal generator 51 connected to the first isolation control line ISi and the complementary line $\overline{\text{ISi}}$ of the first isolation control line. The second isolation control signal and the inverted signal thereof are generated and output from the isolation control signal generator 52 connected to the second isolation control line ISj and the complementary line $\overline{\text{ISj}}$ of the second isolation control line.

Also, the first equalization signal and the inverted signal thereof are generated and output from an equalization signal generator 53 connected to the first equalization control line EQi and the complementary line $\overline{\text{EQi}}$ of the first equalization control line. The second equalization signal and the inverted signal thereof are generated and output from an equalization signal generator 54 connected to the second equalization control line EQj and the complementary line $\overline{\text{EQj}}$ of the second equalization control line.

Operation of memory devices according to the present invention now will be described. The NMOS isolation transistors 64 and 65 of the first switching unit 202 control the operation of the left memory cell array (i) connected to the first pair of bitlines BLi and $\overline{\text{BLi}}$. The NMOS isolation transistors 72 and 73 of the second switching unit 206 control the operation of the right memory cell array (j) connected to the second pair of bitlines BLj and $\overline{\text{BLj}}$. The case in which the left memory cell array (i) connected to the first pair of bitlines BLi and $\overline{\text{BLi}}$ is activated and operated will be described.

When the memory cell array (i) connected to the first pair of bitlines BLi and $\overline{\text{BLi}}$ is activated and operates, the first isolation control signal transmitted through the first isolation control line ISi is at a boosted voltage level VPP. The second isolation control signal transmitted through the second isolation control line ISj is discharged into ground voltage level VSS. This can reduce the load to the sense amplifier 204 during the sensing operation by separating the pair of sensing bitlines SBLi and $\overline{\text{SBLi}}$ from the second pair of bitlines BLj and $\overline{\text{BLj}}$ and by turning off the second switching unit 206.

In particular, in memory devices according to the present invention, the second isolation control signal may be quickly discharged into a reference voltage such as ground voltage VSS by turning on the second discharging unit NB to which the inverted signal of the second isolation control signal is applied, even though the load of the second isolation control line ISj may be large while the second isolation control signal is discharged into the ground voltage level VSS. Thus, the discharge speed of the second isolation control line ISj may be increased by the second discharging unit NB.

Accordingly, the NMOS isolation transistors 64 and 65 of the first switching unit 202 are turned on and the NMOS isolation transistors 72 and 73 of the second switching unit 206 are quickly turned off. Namely, the second pair of bitlines BLj and $\overline{BLj}$ thus can be isolated from the pair of sensing bitlines SBLi and $\overline{SBLi}$ during the sensing operation and the load to the sense amplifier 204 may be reduced. Accordingly, the charge sharing time between the first pair of bitlines BLi and $\overline{BLi}$ and the pair of sensing bitlines SBLi and $\overline{SBLi}$ may be reduced. As a result, faster operation of the sense amplifier 204 may be obtained.

Also, when the memory cell array (i) is activated and operates, the first equalization signal transmitted through the first equalization control line EQi preferably is quickly discharged to ground voltage level VSS. Thus, the first equalizer 200 may be turned off quickly. To achieve this, in memory devices according to the first embodiment of the present invention, the first equalization signal can be quickly discharged to the ground voltage level VSS by turning on the discharging unit NC to which the inverted signal of the first equalization signal is applied, even though the load of the first equalization control line EQi is large.

In memory devices according to first embodiments of the present invention, the size of the layout may increase since the complementary line $\overline{ISi}$ of the first isolation control line, the complementary line $\overline{ISj}$ of the second isolation control line, the complementary line $\overline{EQi}$ of the first equalization control line, and the complementary line $\overline{EQj}$ of the second equalization control line may be located in the sense amplification blocks and conjunction regions.

Figure 4:
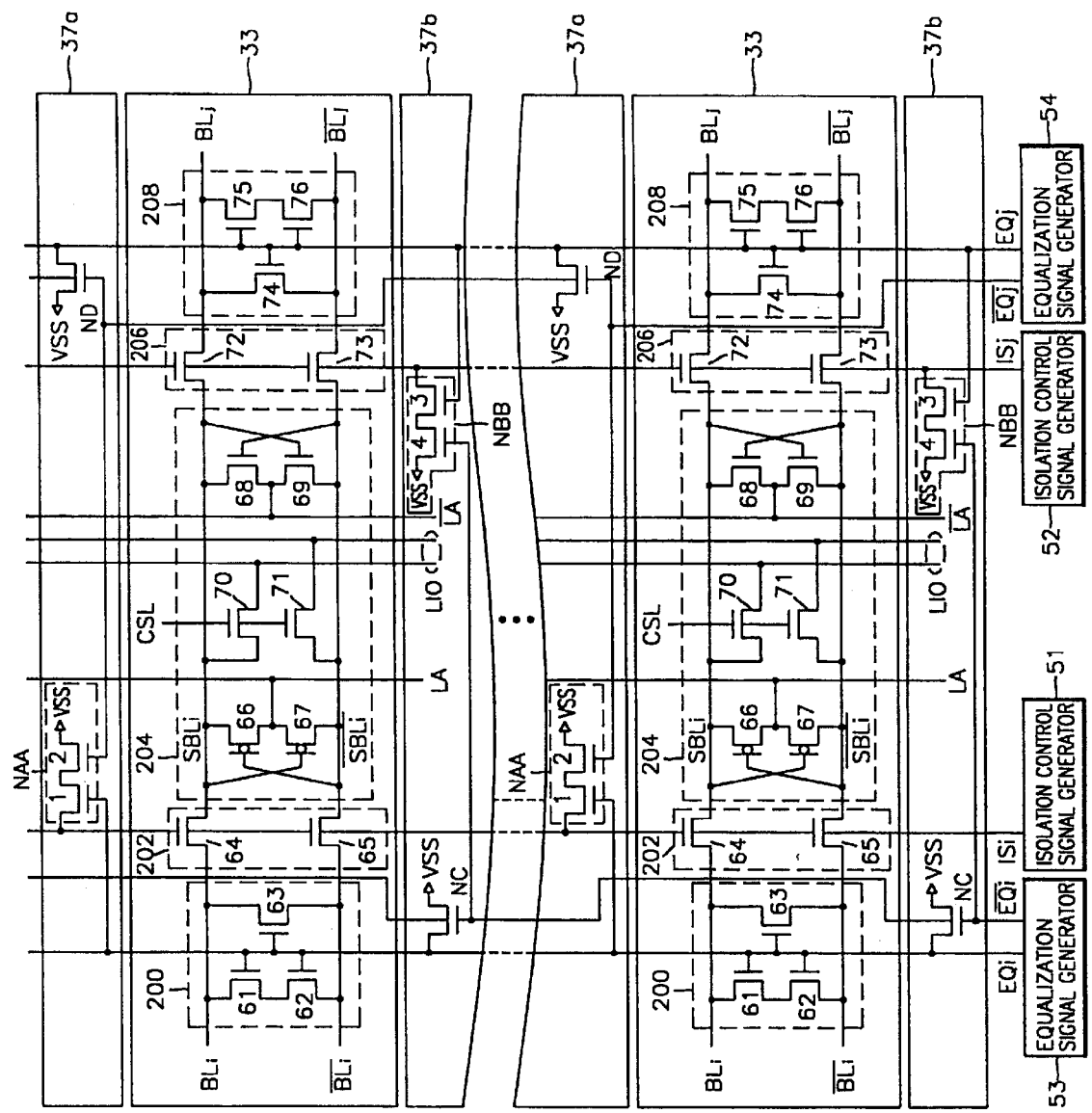
FIG. 4 is a circuit diagram of sense amplification blocks and conjunction regions of integrated circuit memory devices according to second embodiments of the present invention.

FIG. 4 is a circuit diagram of sense amplification blocks and conjunction regions of memory devices according to second embodiments of the present invention.

Referring to FIG. 4, in memory devices according to second embodiments of the present invention, a discharging unit NAA connected between the first isolation control line ISi and a reference voltage such as ground VSS includes two NMOS transistors 1 and 2. A discharging unit NBB connected between the second isolation control line ISj and ground VSS includes two NMOS transistors 3 and 4. The complementary line $\overline{ISi}$ of the first isolation control line and the complementary line $\overline{ISj}$ of the second isolation control line shown in FIG. 3 may be eliminated. Other elements are the same as FIG. 3.

More specifically, the discharging unit NAA includes an NMOS transistor 1, the drain of which is connected to the first isolation control line ISi and the gate of which is connected to the first equalization control line EQi, and an NMOS transistor 2, the drain of which is connected to the source of the NMOS transistor 1, the gate of which is connected to the complementary line $\overline{EQj}$ of the second equalization line, and the source of which is connected to ground VSS. Again, the source and drain connections may be reversed and PMOS transistors may be used. The discharging unit NBB includes an NMOS transistor 3, the drain of which is connected to the second isolation control line ISj and the gate of which is connected to the second equalization control line EQj and an NMOS transistor 4 the drain of which is connected to the source of the NMOS transistor 3, the gate of which is connected to the complementary line $\overline{EQi}$ of the first equalization control line, and the source of which is connected to ground VSS. Again, the source and drain connections may be reversed and PMOS transistors may be used.

The discharging unit NAA preferably is designed to be simultaneously controlled by the first equalization signal and the inverted signal of the second equalization signal, and the discharging unit NBB preferably is designed to be simultaneously controlled by the second equalization signal and the inverted signal of the first equalization signal, for at least the following reason: the first and second equalization signals are all logic "high" in a precharge state. Thus, the first isolation control line ISi and the second isolation control line ISj should be precharged to logic "high", i.e., a supply voltage VDD level. If the discharging unit NAA is designed to be controlled by only the first equalization signal, the discharging unit NAA may be turned on when the first equalization signal is activated to logic "high". Accordingly, the first isolation control line ISi becomes logic "low". If the discharging unit NBB is designed to be controlled by only the second equalization signal, the discharging unit NBB may be turned on by the second equalization signal of logic "high". Accordingly, the second isolation control line ISj becomes logic "low". Therefore, the memory device may not operate properly.

Operation of memory devices according to second embodiments of the present invention now will be described. The case where the left memory cell array (i) connected to the first pair of bitlines BLi and $\overline{BLi}$ is activated will be described.

When the memory cell array (i) connected to the first pair of bitlines BLi and $\overline{BLi}$ is activated and operates, the first isolation control signal transmitted through the first isolation control line ISi is at a boosted voltage VPP level. The second isolation control signal transmitted through the second isolation control line ISj is discharged to ground voltage level VSS. Also, the first equalization signal transmitted through the first equalization control line EQi is at ground voltage level VSS. The second equalization signal transmitted through the second equalization control line EQj is at the supply voltage VDD level. Also, the inverted signal of the first equalization signal transmitted through the complementary line $\overline{EQi}$ of the first equalization control line is at the supply voltage VDD level, and the inverted signal of the second equalization signal transmitted through the complementary line $\overline{EQj}$ of the second equalization control line is at ground voltage level VSS.

Accordingly, when the second isolation control signal is discharged to ground voltage level VSS, the NMOS transistor 3 of the discharging unit NBB is turned on by the second equalization signal. Also, the NMOS transistor 4 of the discharging unit NBB is turned on by the inverted signal of the first equalization signal. As a result, the second isolation control signal transmitted through the second isolation control line ISj may be discharged quickly into ground voltage level VSS. Then, the NMOS transistor 1 of the discharging unit NAA is turned off by the first equalization signal. The NMOS transistor 2 is turned off by the inverted signal of the second equalization signal.

Therefore, in memory devices according to second embodiments of the present invention, the NMOS isolation transistors 64 and 65 of the first switching unit 202 are turned on, and at the same time, the NMOS isolation transistors 72 and 73 of the second switching unit 206 may be turned off quickly. Thus, since the second pair of bitlines BLj and $\overline{BLj}$ are isolated from the pair of sensing bitlines SBLi and $\overline{SBLi}$ during a sensing operation, the load to the sense amplifier 204 may be reduced. Accordingly, the charge sharing time between the pair of first bitlines BLi and $\overline{BLi}$ and the pair of sensing bitlines SBLi and $\overline{SBLi}$ may be reduced. As a result, the sense amplifier 204 can operate at higher speeds.

Moreover, in memory devices according to second embodiments of the present invention, the size of the layout may be reduced since the complementary line $\overline{ISi}$ of the first isolation control line and the complementary line $\overline{ISj}$ of the second isolation control line may be removed from the sense amplification blocks and conjunction regions.

In memory devices according to the present invention, the discharging speed of the first isolation control line ISi and the second isolation control line ISj may be increased by the discharging units NA, NB, NAA, and NBB, even when the load of the first isolation control line ISi and the second isolation control line ISj more than doubles, as in the memory device having a row decoder that is vertically arranged as shown in FIG. 1. Accordingly, since the sense amplifier 204 can quickly start the sense amplifying operation, high-speed operation may be obtained.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device, comprising:
   a pair of bitlines;
   a memory cell array connected to the pair of bitlines;
   a pair of sensing bitlines;
   means for connecting the pair of bitlines and the pair of sensing bitlines in response to an isolation control signal transmitted through an isolation control line;
   means for equalizing the pair of bitlines in response to an equalization signal transmitted through an equalization control line;
   means for sensing and amplifying a voltage difference between the pair of sensing bitlines; and
   means for discharging the isolation control line into a reference voltage in response to an inverted isolation control signal transmitted through a complementary line of the isolation control line.

2. An integrated circuit memory device according to claim 1, wherein the means for discharging comprises an NMOS transistor having a drain connected to the isolation control line, a gate connected to the complementary line of the isolation control line, and a source connected to ground.

3. An integrated circuit memory device according to claim 1, further comprising second means for discharging the equalization control line into the reference voltage.

4. An integrated circuit memory device according to claim 3, wherein the second means for discharging comprises an NMOS transistor having a drain connected to the equalization control line, a gate connected to the complementary line of the equalization control line, and a source connected to ground.

5. An integrated circuit memory device, comprising:
   a first and a second pair of bitlines;
   a first memory cell array connected to the first pair of bit lines;
   a second memory cell array connected to the second pair of bit lines;
   a pair of sensing bitlines;
   first means for connecting the first pair of bitlines and the pair of sensing bitlines in response to a first isolation control signal transmitted through a first isolation control line;
   second means for connecting the second pair of bitlines to the pair of sensing bitlines in response to a second isolation control signal transmitted through a second isolation control line;
   first means for equalizing the first pair of bitlines in response to a first equalization signal transmitted through a first equalization control line;
   second means for equalizing the second pair of bitlines in response to a second equalization signal transmitted through a second equalization control line;
   means for sensing and amplifying a voltage difference between the pair of sensing bitlines;
   first means for discharging the first isolation control line into a reference voltage during activation of the second memory cell array; and
   second means for discharging the second isolation control line into the reference voltage during activation of the first memory cell array.

6. An integrated memory device according to claim 5, wherein the first means for discharging comprises an NMOS transistor having a drain connected to the first isolation control line, a gate connected to the complementary line of the first isolation control line, and the source of which is connected to ground.

7. An integrated circuit memory device according to claim 5, wherein the first means for discharging comprises:
   a first NMOS transistor having a drain connected to the first isolation control line, and a gate connected to the first equalization control line; and
   a second NMOS transistor having a drain connected to the source of the first transistor, a gate connected to the complementary line of the second equalization control line, and a source connected to ground.

8. An integrated circuit memory device according to claim 5, wherein the second means for discharging comprises an NMOS transistor, having a drain connected to the second isolation control line, a gate connected to the complementary line of the second isolation control line, and a source connected to ground.

9. An integrated circuit memory device according to claim 5, wherein the second means for discharging comprises:
   a first NMOS transistor having a drain connected to the second isolation control line, and a gate connected to the second equalization control line; and
   a second NMOS transistor having a drain connected to the source of the first NMOS transistor, a gate connected to the complementary line of the first equalization control line, and a source connected to ground.

10. An integrated circuit memory device according to claim 5, further comprising:
    third means for discharging the first equalization control line into the reference voltage; and
    fourth means for discharging the second equalization control line into the reference voltage.

11. An integrated circuit memory device according to claim 10, wherein the third means for discharging comprises an NMOS transistor having a drain connected to the first equalization control line, a gate connected to the complementary line of the first equalization control line, and a source connected to ground.

12. An integrated circuit memory device according to claim 10, wherein the fourth means for discharging comprises an NMOS transistor having a drain connected to the second equalization control line, a gate connected to the complementary line of the second equalization control line, and a source connected to ground.

13. An integrated circuit memory device, comprising:
   a plurality of memory cell arrays, each having a pair of bit lines and a plurality of memory cells connected to the pair of bit lines;
   a plurality of sense amplification blocks on the left and right sides of the respective memory cell arrays in a column direction, each including a pair of sensing bit lines, means for connecting the pair of bit lines to the pair of sensing bit lines in response to an isolation control signal transmitted through an isolation control line, means for equalizing the pair of bit lines in response to an equalization signal transmitted through an equalization control line and means for sensing and amplifying a voltage difference between the pair of sensing bit lines; and
   a plurality of conjunction regions at the upper and lower ends of the sense amplification blocks in a wordline direction each including means for discharging the isolation control line into a reference voltage in response to an inverted isolation control signal transmitted through a complementary line of the isolation control line.

14. An integrated circuit memory device according to claim 13, wherein the first means for discharging comprises an NMOS transistor having a drain connected to the isolation control line, a gate connected to the complementary line of the isolation control line, and a source connected to ground.

15. An integrated circuit memory device according to claim 13, wherein each conjunction region further comprises second means for discharging the equalization control line into the reference voltage.

16. An integrated circuit memory device according to claim 15, wherein the second means for discharging comprises an NMOS transistor having a drain connected to the equalization control line, a gate connected to the complementary line of the equalization control line, and a source connected to ground.

17. An integrated circuit memory device, comprising:
   a pair of bit lines;
   a memory cell array connected to the p air of bit lines;
   a pair of sensing bit lines;
   a switching unit that connects the pair of bit lines and the pair of sensing bit lines in response to an isolation control signal transmitted through an isolation control line;
   an equalizer that equalizes the pair of bit lines in response to an equalization signal transmitted through an equalization control line;
   a sense amplifier that senses and amplifies a voltage difference between the pair of sensing bit lines; and
   a discharge circuit that is connected between the isolation control line and a reference voltage, to discharge the isolation line into the reference voltage in response to an inverted isolation control signal transmitted through a complementary line of the isolation control line.

18. An integrated circuit memory device according to claim 17 wherein the discharge circuit comprises a field effect transistor including a source and drain that are serially connected between the isolation control line and the reference voltage and a gate that is connected to the complementary line of the isolation control line.

19. An integrated circuit memory device according to claim 17 further comprising a second discharge circuit that is connected between the equalization control line and the reference voltage to discharge the equalization control line into the reference voltage.

20. An integrated circuit memory device according to claim 19 wherein the second discharge circuit comprises a field effect transistor including a source and drain that are serially connected between the equalization control line and the reference voltage, and a gate that is connected to the complementary line of the equalization control line.

21. An integrated circuit memory device, comprising:
   a first and a second pair of bit lines;
   a first memory cell array connected to the first pair of bit lines;
   a second memory cell array connected to the second pair of bit lines;
   a pair of sensing bit lines;
   a first switching unit that connects the first pair of bit lines to the pair of sensing bit lines in response to a first isolation control signal transmitted to a first isolation control line;
   a second switching unit that connects the second pair of bit lines to the pair of sensing bit lines in response to a second isolation control signal that is transmitted through a second isolation control line;
   a first equalizer that equalizes the first pair of bit lines in response to a first equalization signal transmitted through a first equalization control line;
   a second equalizer that equalizes the second pair of bit lines in response to a second equalization signal transmitted through a second equalization control line;
   a sense amplifier that senses and amplifies a voltage difference between the pair of sensing bit lines;
   a first discharge circuit that is connected between the first isolation control line and a reference voltage to discharge a first isolation control line into the reference voltage during activation of the second memory cell array; and
   a second discharge circuit that is connected between the second isolation control line and the reference voltage to discharge the second isolation control line into the reference voltage during activation of the first memory cell array.

22. An integrated circuit memory device according to claim 21 wherein the first discharge circuit comprises a field effect transistor including a source and drain that are connected between the first isolation control line and the reference voltage, and a gate that is connected to the complementary line of the first isolation control line.

23. An integrated circuit memory device according to claim 21 wherein the first discharge circuit comprises first and second field effect transistors, the sources and drains of which are serially connected between the first isolation control line and the reference voltage, the gate of the first field effect transistor being connected to the first equalization control line and the gate of the second field effect transistor being connected to the complementary line of the second equalization control line.

24. An integrated circuit memory device according to claim 21 further comprising:
   a third discharge circuit that is connected between the first equalization control line and the reference voltage to discharge the first equalization control line into the reference voltage; and a fourth discharge circuit that is connected between the second equalization control line and the reference voltage to discharge the second equalization control line into the reference voltage.

25. An integrated circuit memory device, comprising:

a plurality of memory cell arrays, each having a pair of bit lines and a plurality of memory cells connected to the pair of bit lines;

a plurality of sense amplification blocks on opposite sides of the respective memory cell arrays in a first direction, each including a pair of sensing bit lines, a switching unit that connects the pair of bit lines to the pair of sensing bit lines in response to an isolation control signal that is transmitted through an isolation control line, an equalization circuit that equalizes the pair of bit lines in response to an equalization signal transmitted through an equalization control line, and a sense amplifier that senses and amplifies a voltage difference between the pair of sensing bit lines; and a plurality of regions at the opposite ends of the sense amplification blocks in a second direction that is different from the first direction, each region including a first discharge circuit that is connected between the isolation control line and a reference voltage to discharge the isolation control line into the reference voltage in response to an inverted isolation control signal that is transmitted through a complementary line of the isolation control line.

26. An integrated circuit memory device according to claim 25 wherein the discharge circuit comprises a field effect transistor including a source and drain that are serially connected between the isolation control line and the reference voltage and a gate that is connected to the complementary line of the isolation control line.

27. An integrated circuit memory device according to claim 25 wherein each of the regions further comprises a second discharge circuit that is connected between the equalization control line and the reference voltage to discharge the equalization control line into the reference voltage.

28. A method of controlling an integrated circuit memory device, the integrated circuit memory device comprising a pair of bit lines, a memory cell array connected to the pair of bit lines, a pair of sensing bit lines, a switching unit that connects the pair of bit lines and the pair of sensing bit lines in response to an isolation control signal that is transmitted through an isolation control line, an equalizer that equalizes the pair of bit lines in response to an equalization signal transmitted through an equalization control line, and a sense amplifier that senses and amplifies a voltage difference between the pair of sensing bit lines; the method comprising the step of:

discharging the isolation control line into a reference voltage in response to an inverted isolation control signal that is transmitted through a complementary line of the isolation control line.

29. A method according to claim 28 further comprising the step of discharging the equalization control line into the reference voltage.

30. A method of controlling an integrated circuit memory device, the integrated circuit memory device comprising a first and a second pair of bit lines, a first memory cell array connected to the first pair of bit lines, a second memory cell array connected to the second pair of bit lines, a pair of sensing bit lines, a first switching unit that connects the first pair of bit lines and the pair of sensing bit lines in response to a first isolation control signal that is transmitted through a first isolation control line, a second switching unit that connects the second pair of bit lines to the pair of sensing bit lines in response to a second isolation control signal that is transmitted to a second isolation control line, a first equalizer that equalizes the first pair of bit lines in response to a first equalization signal transmitted through a first equalization control line, a second equalizer that equalizes the second pair of bit lines in response to a second equalization signal transmitted through a second equalization control line and a sense amplifier that senses and amplifies a voltage difference between the pair of sensing bit lines, the method comprising the steps of:

discharging the first isolation control line into the reference voltage during activation of the second memory cell array; and discharging the second isolation control line into the reference voltage during activation of the first memory cell array.

* * * * *